(12) United States Patent
Chang et al.

(10) Patent No.: US 8,138,616 B2
(45) Date of Patent: Mar. 20, 2012

(54) BOND PAD STRUCTURE

(75) Inventors: Tien-Chang Chang, Hsinchu (TW); Tao Cheng, Hsinchu (TW); Chien-Hui Chuang, Taipei County (TW); Bo-Shih Huang, Kaohsiung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 345 days.

(21) Appl. No.: 12/168,161

(22) Filed: Jul. 7, 2008

(65) Prior Publication Data
US 2010/0001412 A1 Jan. 7, 2010

(51) Int. Cl.
*H01L 23/48* (2006.01)
*H01L 23/52* (2006.01)
*H01L 29/40* (2006.01)

(52) U.S. Cl. ........................................ 257/784; 257/786

(58) Field of Classification Search .................. 257/784, 257/786, 758
See application file for complete search history.

(56) References Cited

U.S. PATENT DOCUMENTS

| | | | |
|---|---|---|---|
| 7,071,575 B2 | 7/2006 | Wu | |
| 7,301,231 B2 * | 11/2007 | Antol et al. | 257/700 |
| 2006/0097406 A1 * | 5/2006 | Wu et al. | 257/784 |
| 2006/0226535 A1 | 10/2006 | Antol | |
| 2010/0065954 A1 * | 3/2010 | Tu et al. | 257/686 |

* cited by examiner

*Primary Examiner* — Sheila V Clark
(74) *Attorney, Agent, or Firm* — Winston Hsu; Scott Margo

(57) ABSTRACT

A bond pad structure of an integrated circuit includes a conductive pad disposed on a first dielectric layer, a first conductive block formed in a second dielectric layer below the first dielectric layer and electrically connected to the conductive pad through a first via plug formed in the first dielectric layer, and an electrically floating first conductive plate situated under the conductive pad.

22 Claims, 10 Drawing Sheets

BOND PAD STRUCTURE

BACKGROUND OF THE INVENTION

1. Field of the Invention

The present invention relates generally to semiconductor devices and, more particularly, to a bond pad structure capable of implementing bonding over active circuitry and reducing parasitic capacitance in an integrated circuit.

2. Description of the Prior Art

The semiconductor industry has recently experienced technological advances that have permitted dramatic increases in circuit density and complexity, and equally dramatic decreases in power consumption and package sizes. These advancements have been accompanied by an increased demand for faster operation, reduction in cost, and higher reliability of semiconductor devices. The ability to form structures in increasingly smaller areas having increasingly dense circuitry, as well as the ability to place more semiconductor chips on a wafer, are important for meeting these and other needs of advancing technologies.

In order to reduce the size of the chip, it is desirable to form bond pads directly over active circuitry. As known in the art, bond pads are typically arranged in rows along four chip sides. The conventional design rules exclude the area covered by the bond pads from use for laying out actual circuit patterns because of the high risk of damaging the circuit structures due to the unavoidable forces needed in the bonding process such as wire bonding process or gold ball bonding process. To implement the bonding over active circuitry, various reinforced pad structures, which are mainly used to counteract mechanical stress exerted on the pad during the bonding process, have been employed. However, such reinforced pad structures increase the parasitic capacitance in an integrated circuit, which adversely affects the chip performance.

SUMMARY OF THE INVENTION

It is one object of the present invention to provide an improved integrated circuit having a reinforced bond pad structure capable of implementing bonding over active circuitry and reducing parasitic capacitance.

According to one embodiment, a bond pad structure of an integrated circuit includes a conductive pad disposed on a first dielectric layer, a first conductive block formed in a second dielectric layer below the first dielectric layer and electrically connected to the conductive pad through a first via plug formed in the first dielectric layer, and an electrically floating first conductive plate situated under the conductive pad.

In one aspect, a bond pad structure of an integrated circuit includes a conductive pad disposed on a first dielectric layer, a first conductive frame formed in a second dielectric layer below the first dielectric layer and electrically connected to the conductive pad through a first via plug formed in the first dielectric layer, and an electrically floating first conductive piece situated under the conductive pad and surrounded by the first conductive frame.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The embodiments of this invention will now be explained with the accompanying figures. Throughout the specification and drawings, the symbol "Mn" refers to the topmost level of the metal layers fabricated in the integrated circuit chip, while "Mn−1" refers to the metal layer that is just one level lower than the topmost metal layer and so on, wherein, n may range between 5 and 8 but not limited thereto. The material of the metal layer may include but not be limited to nickel, cobalt, copper, aluminum or a combination thereof. The symbol "V" refers to the via plug between two adjacent conductive metal layers. For example, Vn refers to the via plug interconnecting Mn−1 to Mn.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. The use of the term "low dielectric constant" or "low k" herein means a dielectric constant (k value) that is less than the dielectric constant of a conventional silicon oxide. The low k dielectric constant may be less than about 4.

Figure 1:
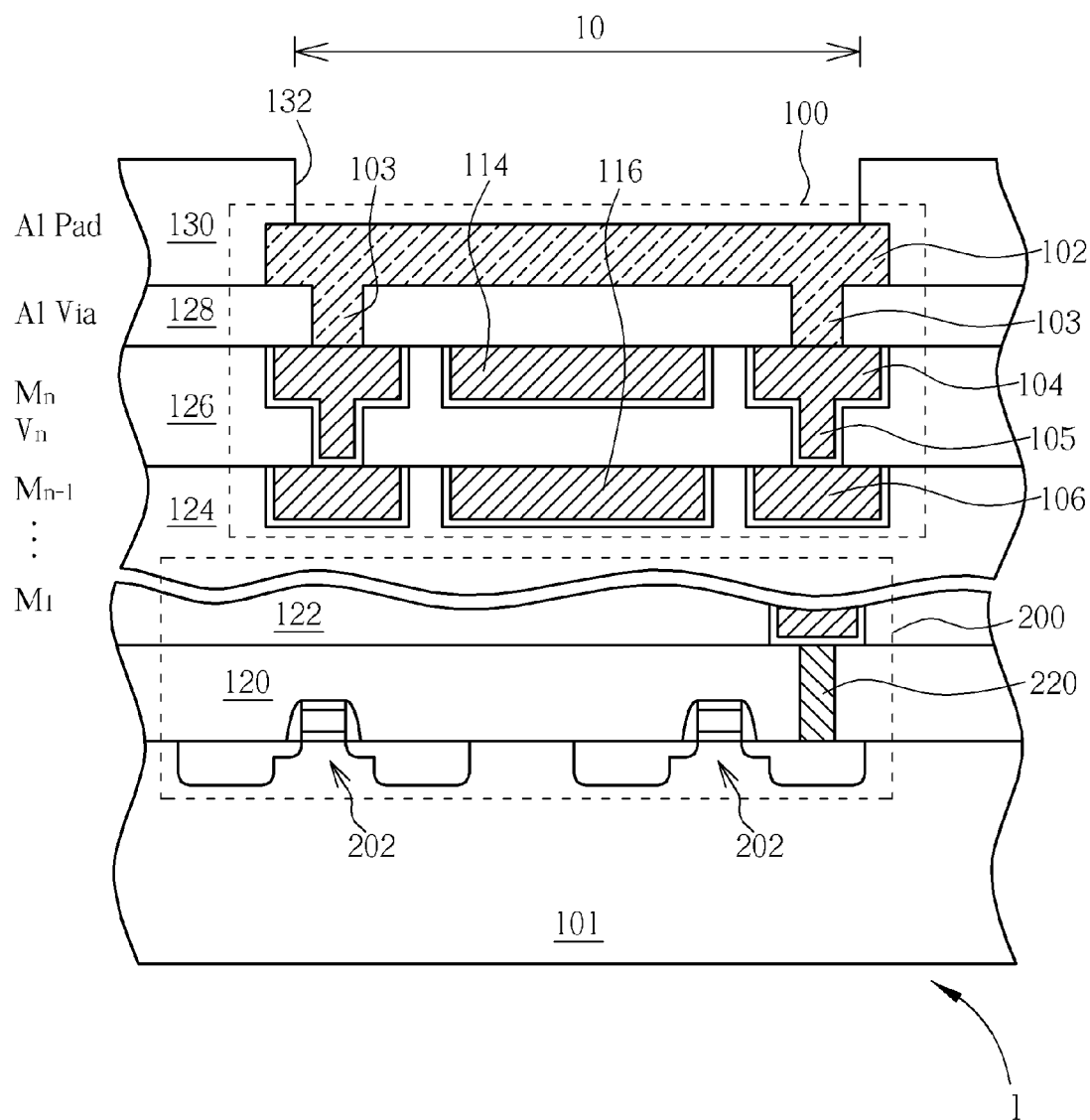
FIG. 1 is a schematic cross-sectional diagram illustrating a portion of an exemplary integrated circuit in accordance with the first embodiment of the present invention.
Figure 2:
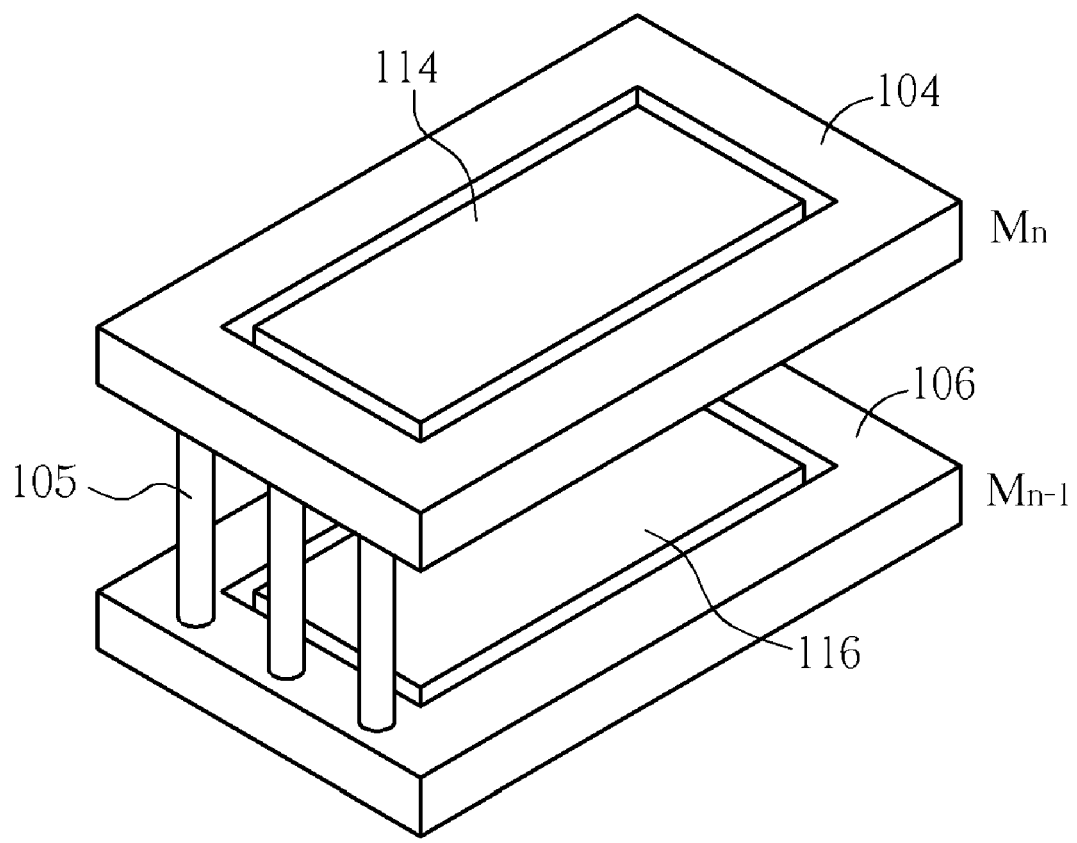
FIG. 2 is a perspective view showing the lower portion of the bond pad structure of FIG. 1.

Please refer to FIG. 1 and FIG. 2. FIG. 1 is a schematic cross-sectional diagram illustrating pivotal portions of an exemplary integrated circuit 1 capable of implementing bonding over active circuitry with reduced parasitic capacitance in accordance with the first embodiment of the present invention. FIG. 2 is a perspective view showing the lower portion of the bond pad structure of FIG. 1.

As shown in FIG. 1 and FIG. 2, the integrated circuit 1 according to the present invention comprises a bond pad area 10. A bond pad structure 100 is provided within the bond pad area 10. An active circuit 200 may be formed directly under the bond pad structure 100. For example, the active circuit 200 may include an input/output (I/O) circuit or an electrostatic discharge (ESD) circuit, each of which may further consist of a plurality of semiconductor components 202 such as metal-oxide-semiconductor field-effect transistors (MOS-FETs) that are fabricated on a main surface of a semiconductor substrate 101. Inter-metal dielectric (IMD) layers 120-128 are deposited over the semiconductor substrate 101. The IMD layers 120-128 may be formed of low dielectric constant (low-k) materials or ultra low-k (k<2.5) materials, but not limited thereto. The IMD layers 120-128 may further comprise dielectric materials such as silicon oxide, silicon nitride, silicon carbide, silicon oxy-nitride or a combination thereof.

According to this invention, metal layers M1-Mn and respective via plugs may be fabricated using conventional copper damascene processes or dual damascene processes, which are well known in the art and are thus not discussed further. The first level of the metal layers, i.e., M1 is fabricated in the IMD layer 122. A contact plug 220, typically tungsten plug, is formed in the IMD layer 120 to interconnect M1 with the semiconductor components 202. The topmost metal layer Mn and the integral via plug Vn are fabricated in the IMD layer 126. The metal layer Mn-1 that is just one level below Mn is fabricated in the IMD layer 124.

The bond pad structure 100 comprises a conductive pad 102 that is formed on the dielectric layer 128 situated directly above the IMD layer 126. The material of the conductive pad 102 may include but not be limited to tungsten, aluminum, copper or a combination thereof. A passivation layer 130 such as silicon nitride or photo-definable polyimide may be deposited directly above the dielectric layer 128 and covers the periphery of the conductive pad 102. In the passivation layer 130, an opening 132 is provided to expose a portion of the conductive pad 102 to facilitate the subsequent bonding process. The conductive pad 102 may be defined by conventional methods. For example, a dry etching process may be first carried out to etch via openings in the dielectric layer 128. A conventional aluminum sputtering process may then be performed to sputter aluminum into these via openings and over the dielectric layer 128. Conventional lithography and metal dry etching may then be carried out to form the integrated conductive pad 102 and via plugs 103. The via plugs 103 may have various shapes, for example, square shape or bar shape. The material of the via plugs 103 may include but not be limited to tungsten, aluminum, copper or a combination thereof.

The bond pad structure 100 may further comprise a conductive frame 104 that is formed in the topmost metal layer Mn. The conductive frame 104 may encircle an electrically floating conductive piece 114 that is also formed in the topmost metal layer Mn. The material of the conductive frame 104 and the electrically floating conductive piece 114 may include but not be limited to nickel, cobalt, copper, aluminum or a combination thereof.) The conductive frame 104 is electrically connected with the overlying conductive pad 102 through the conductive via plugs 103. The conductive piece 114 is isolated from the conductive frame 104. The conductive frame 104 may have a shape and dimensions corresponding to the peripheral contour of the overlying conductive pad 102. For the sake of simplicity, the conductive pad 102 and via plugs 103 are omitted in FIG. 2.

As best seen in FIG. 2, the bond pad structure 100 may further comprise a conductive frame 106 that is formed in Mn-1. Likewise, the conductive frame 106 may encircle an electrically floating conductive piece 116 that is also formed in Mn-1. The material of the conductive frame 106 and the electrically floating conductive piece 116 may include but not be limited to nickel, cobalt, copper, aluminum or a combination thereof.) The conductive frame 106 is electrically connected with the overlying conductive frame 104 through the via plugs 105. The via plugs 105 may have various shapes, for example, square shape or bar shape. The conductive piece 116 is isolated from the conductive frame 106. The conductive frame 106 may have a shape and dimensions corresponding to the peripheral contour of the overlying conductive frame 104. The electrically floating conductive pieces 114 and 116 help reduce the parasitic capacitance in the integrated circuit 1.

During bonding, a part of the mechanical stress exerted on the conductive pad 102 can be absorbed and counteracted by the conductive frames 104, 106 and conductive pieces 114, 116, thereby protecting the underlying active circuit 200 from potential damages. According to the simulation results, the integrated circuit 1 of this invention has significantly reduced parasitic capacitance (~42 fF) compared to the prior art structures (>200 fF).

Figure 3:
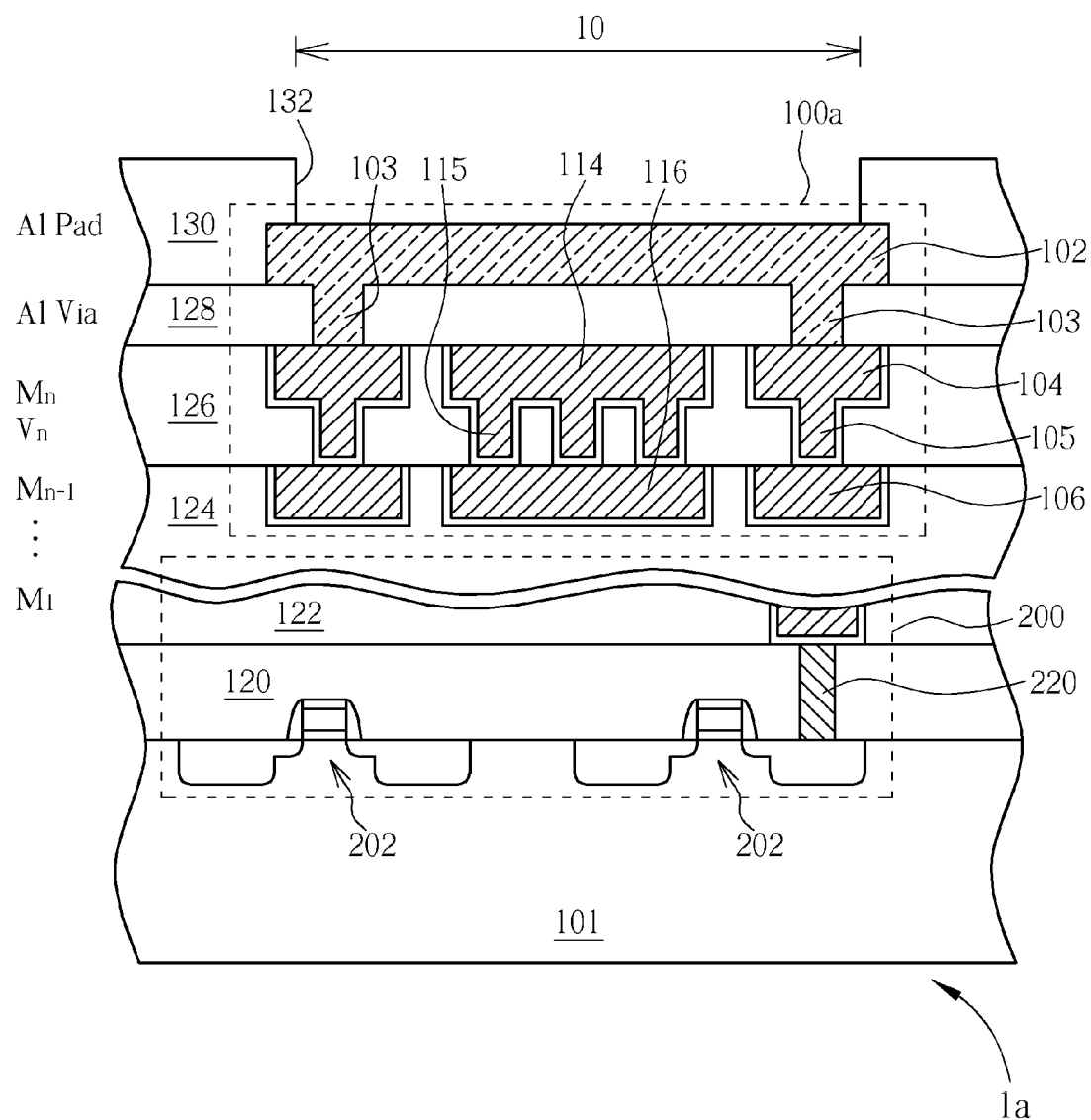
FIG. 3 is a schematic cross-sectional diagram illustrating another exemplary integrated circuit in accordance with the second embodiment of the present invention.

FIG. 3 is a schematic cross-sectional diagram illustrating another exemplary integrated circuit 1a in accordance with the second embodiment of the present invention. As shown in FIG. 3, the difference between the bond pad structure 100 of FIG. 1 and the bond pad structure 100a of FIG. 3 is that the electrically floating conductive pieces 114 and 116 are interconnected together by the dummy via plugs 115 that may be integrally formed with the conductive piece 114 using damascene methods.

Figure 4:
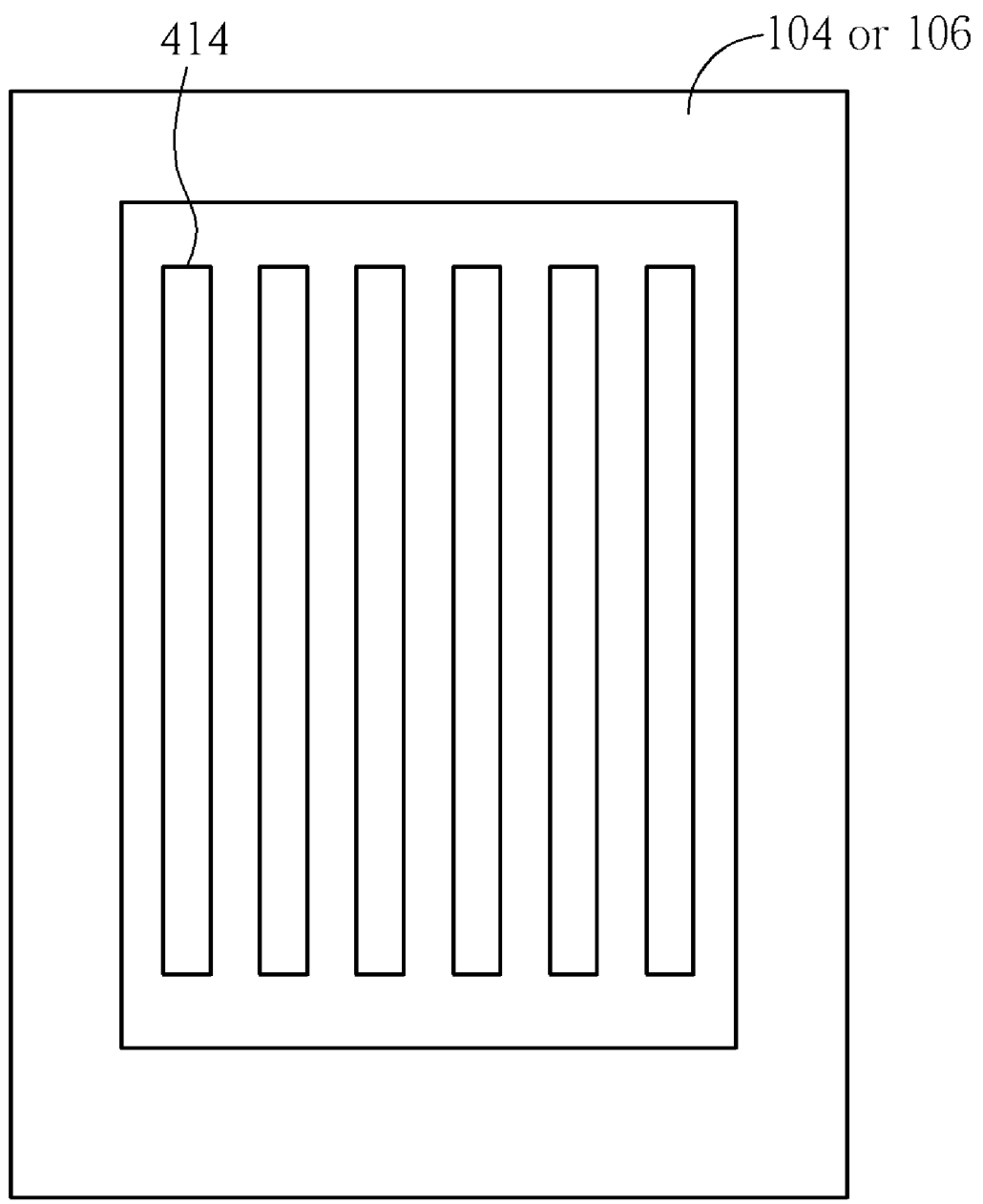
FIGS. 4-7 show top views of variant patterns of the conductive piece surrounded by the formed conductive frame according to the present invention.
Figure 5:
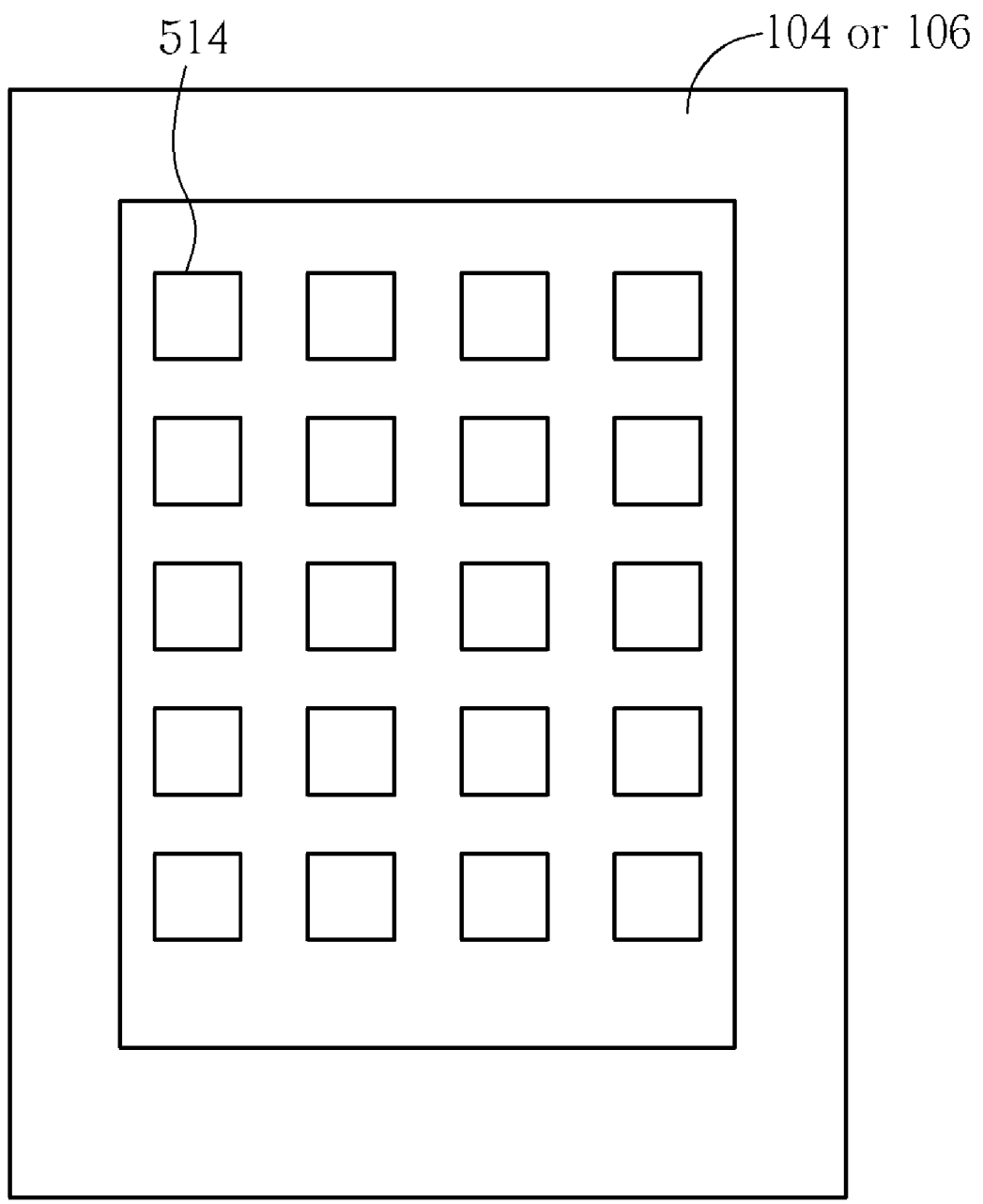
Figure 6:
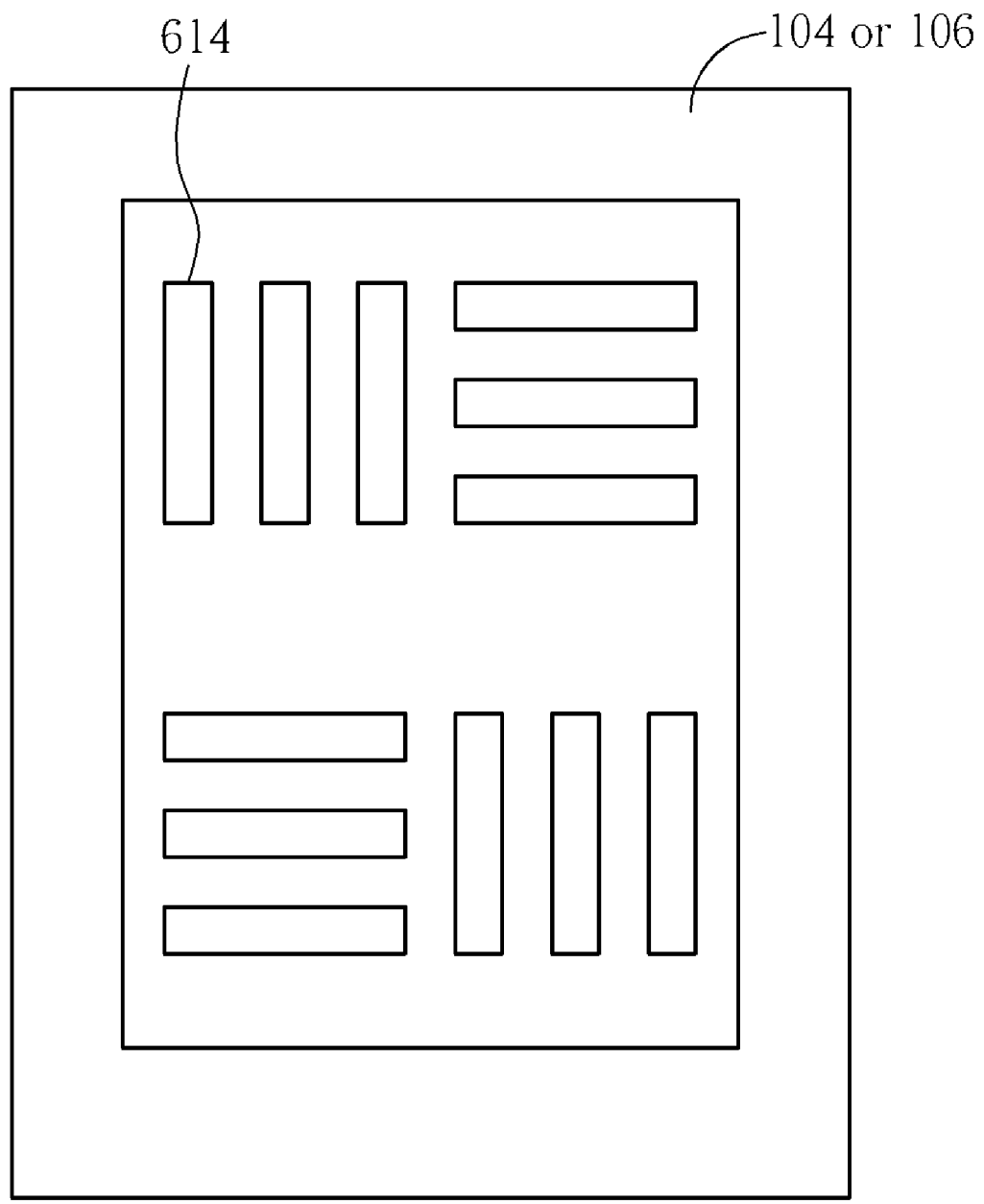
Figure 7:
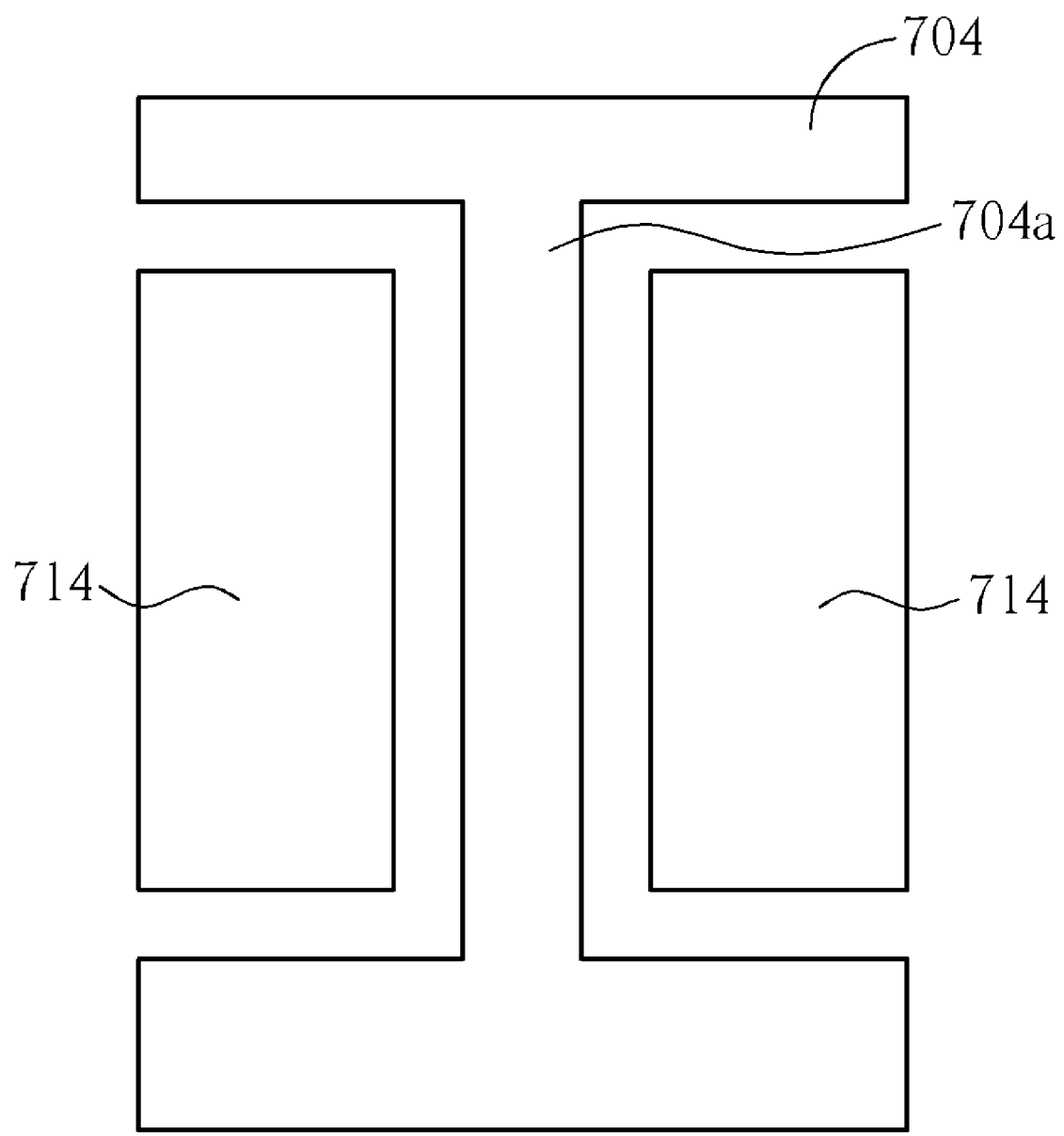

FIGS. 4-7 show top views of variant patterns of the conductive piece surrounded by the conductive frame 104 or 106 according to the present invention. In FIG. 4, a plurality of electrically floating, bar-shaped conductive pieces 414 are arranged in parallel with each other and are surrounded by the conductive frame 104 or 106. In FIG. 5, a plurality of electrically floating, square-shaped conductive pieces 514 are surrounded by the conductive frame 104 or 106. As shown in FIG. 6, four sets of parallel bars 614 are surrounded by the conductive frame 104 or 106. One set of the parallel bars 614 are arranged perpendicular to the adjacent set of the parallel bars 614. As shown in FIG. 7, the bond pad structure includes a conductive frame 704 that has open sides and two electrically floating conductive pieces 714 that are disposed at two opposite sides of the connecting rib 704a.

Figure 8:
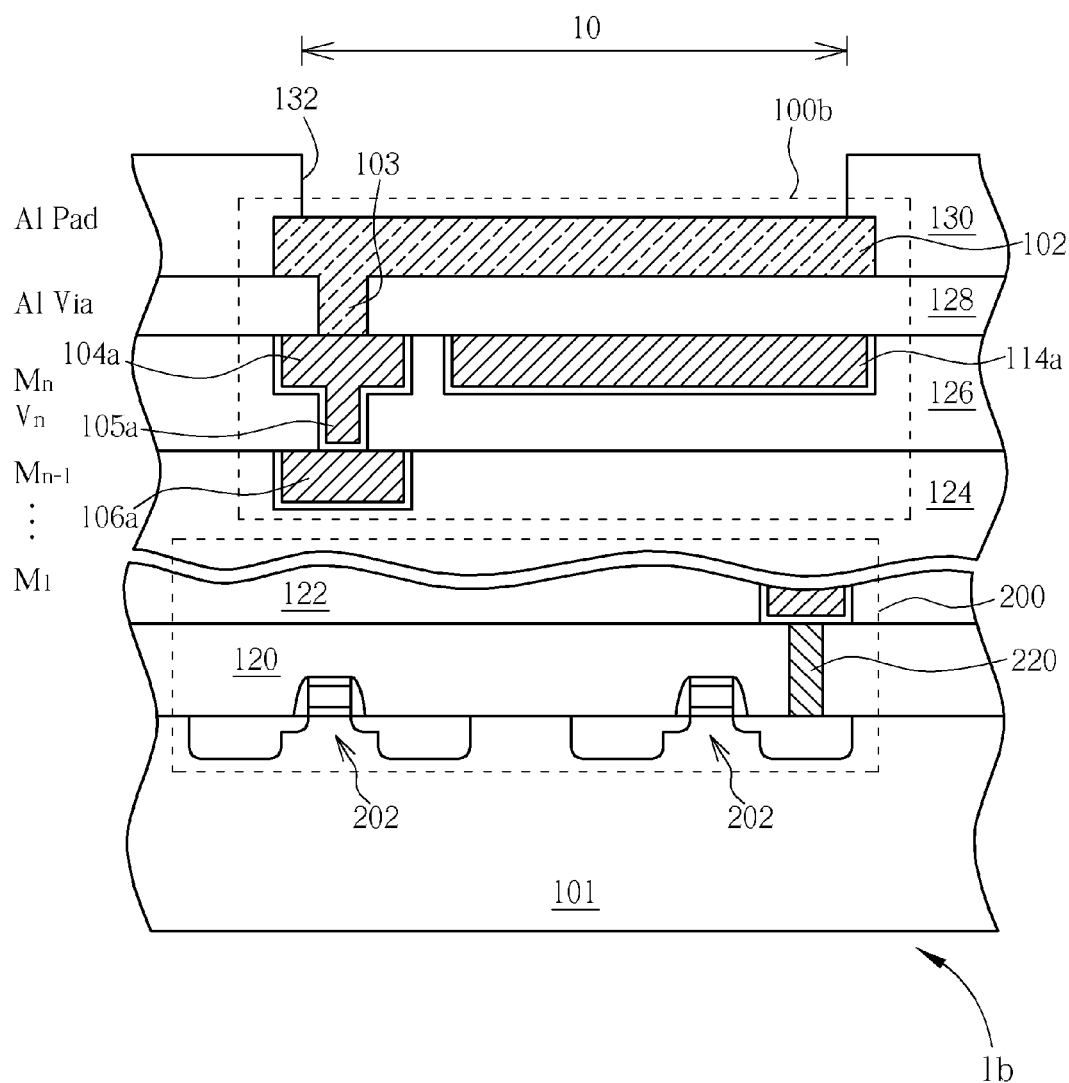
FIG. 8 is a schematic cross-sectional diagram illustrating an integrated circuit in accordance with the third embodiment of the present invention.

FIG. 8 is a schematic cross-sectional diagram illustrating an integrated circuit 1b in accordance with the third embodiment of the present invention. As shown in FIG. 8, the integrated circuit 1b comprises a bond pad area 10. A bond pad structure 100b is provided within the bond pad area 10. An active circuit 200 may be formed directly under the bond pad structure 100b. The active circuit 200 may include an I/O circuit or an ESD circuit, each of which may further consist of a plurality of semiconductor components 202 fabricated on a main surface of the semiconductor substrate 101. IMD layers 120-128 are deposited over the semiconductor substrate 101. The IMD layers 120-128 may be formed of low-k materials or ultra low-k materials. Metal layers M1-Mn and respective via plugs may be fabricated in respective IMD layers 122-126 using conventional copper damascene processes or dual damascene processes.

The bond pad structure 100b comprises a conductive pad 102 that is formed on the dielectric layer 128 situated directly above the IMD layer 126. A passivation layer 130 such as silicon nitride or polyimide may be deposited directly above the dielectric layer 128 and covers the periphery of the conductive pad 102. In the passivation layer 130, an opening 132 is provided to expose a portion of the conductive pad 102 to facilitate the subsequent bonding process. The conductive pad 102 may be defined by conventional methods. For example, a dry etching process may first be carried out to etch via openings in the dielectric layer 128. A conventional aluminum sputtering process may then be performed to sputter aluminum into these via openings and over the dielectric layer 128. Conventional lithography and metal dry etching may then be carried out to form the integrated conductive pad 102 and via plugs 103. The via plugs 103 may have various shapes, for example, square shape or bar shape.

The bond pad structure 100b further comprises a conductive block 104a and an electrically floating conductive plate 114a, both of which may be formed in the topmost metal layer Mn. The conductive block 104a and the electrically floating conductive plate 114a may both be situated directly under the conductive pad 102, wherein the electrically floating conductive plate 114a may have a much larger surface area than that of the conductive block 104a. The conductive plate 114a is isolated from the conductive block 104a. The conductive block 104a is electrically connected with the overlying conductive pad 102 through the conductive via plugs 103. A conductive block 106a formed in Mn−1 is situated directly under the conductive block 104a. The conductive block 106a is electrically connected with the overlying conductive block 104a through the via plugs 105a. The via plugs 105a may have various shapes, for example, square shape or bar shape. The electrically floating conductive plate 114a helps reduce the parasitic capacitance in the integrated circuit 1b.

Figure 9:
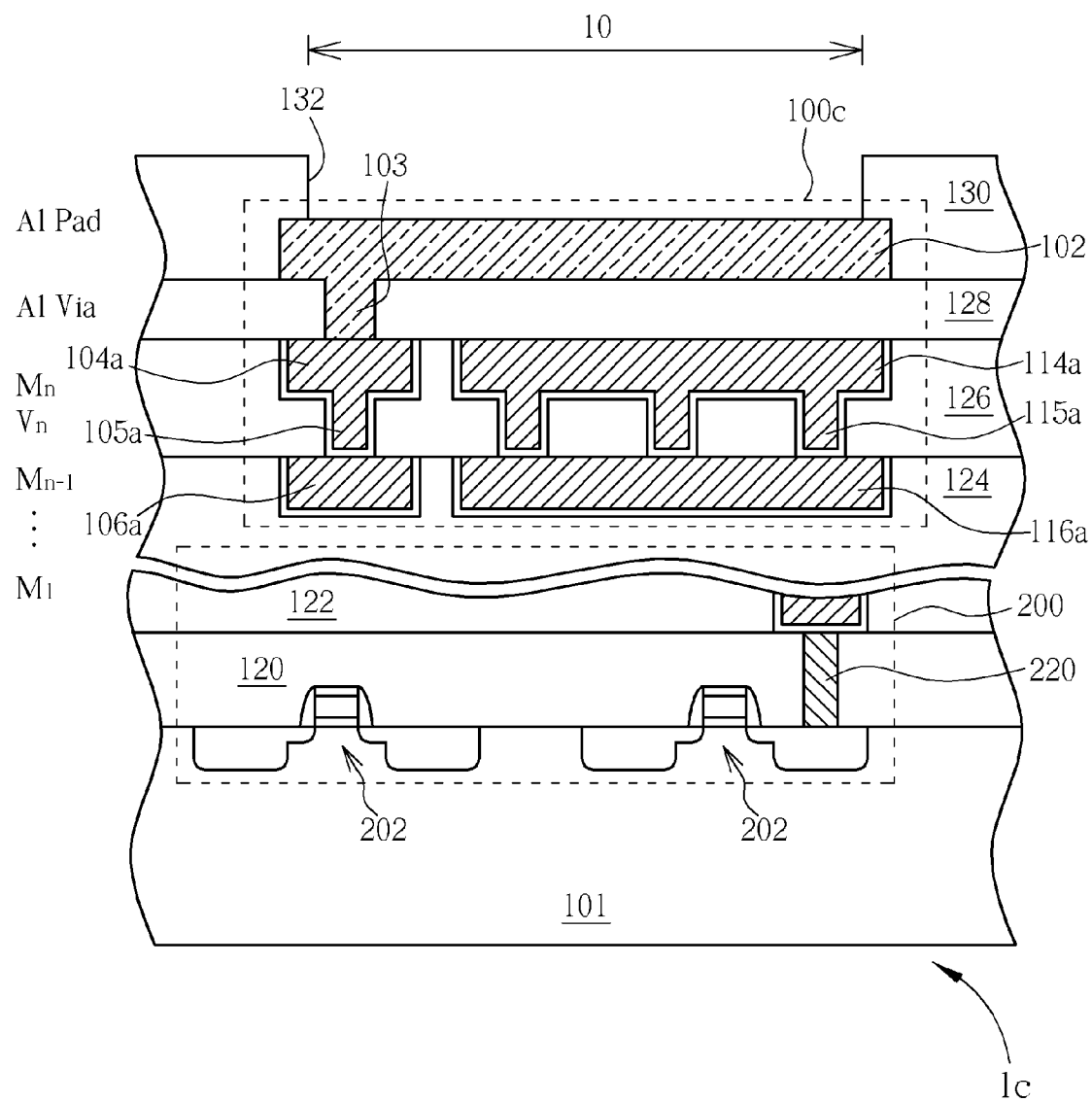
FIG. 9 is a schematic cross-sectional diagram illustrating an integrated circuit in accordance with the fourth embodiment of the present invention.

FIG. 9 is a schematic cross-sectional diagram illustrating an integrated circuit 1c in accordance with the fourth embodiment of the present invention. Likewise, the integrated circuit 1c comprises a bond pad area 10. A bond pad structure 100c is provided within the bond pad area 10. An active circuit 200 may be formed directly under the bond pad structure 100c. The active circuit 200 may include an I/O circuit or an ESD circuit, each of which may further consist of a plurality of semiconductor components 202 fabricated on a main surface of the semiconductor substrate 101. IMD layers 120-128 are deposited over the semiconductor substrate 101. The IMD layers 120-128 may be formed of low-k materials or ultra low-k materials. Metal layers M1-Mn and respective via plugs may be fabricated in respective IMD layers 122-126 using conventional copper damascene processes or dual damascene processes.

The bond pad structure 100c comprises a conductive pad 102 that is formed on the dielectric layer 128 situated directly above the IMD layer 126. A passivation layer 130 such as silicon nitride or polyimide may be deposited directly above the dielectric layer 128 and covers the periphery of the conductive pad 102. In the passivation layer 130, an opening 132 is provided to expose a portion of the conductive pad 102 to facilitate the subsequent bonding process. The conductive pad 102 may be defined by conventional methods. For example, a dry etching process may first be carried out to etch via openings in the dielectric layer 128. A conventional aluminum sputtering process may then be performed to sputter aluminum into these via openings and over the dielectric layer 128. Conventional lithography and metal dry etching may then be carried out to form the integrated conductive pad 102 and via plugs 103. The via plugs 103 may have various shapes, for example, square shape or bar shape.

The bond pad structure 100c further comprises a conductive block 104a and an electrically floating conductive plate 114a, both of which may be formed in the topmost metal layer Mn. The conductive block 104a and the electrically floating conductive plate 114a may both be situated directly under the conductive pad 102, wherein the electrically floating conductive plate 114a may have a much larger surface area than that of the conductive block 104a. The conductive plate 114a is isolated from the conductive block 104a. The conductive block 104a is electrically connected with the overlying conductive pad 102 through the conductive via plugs 103. A conductive block 106a formed in Mn−1 may be situated directly under the conductive block 104a. The conductive block 106a may be electrically connected with the overlying conductive block 104a through the via plugs 105a. The via plugs 105a may have various shapes, for example, square shape or bar shape. The bond pad structure 100c further comprises an electrically floating conductive plate 116a that may also be formed in Mn−1. The electrically floating conductive plate 116a may be situated directly under the electrically floating conductive plate 114a and is connected with the electrically floating conductive plate 114a through dummy via plugs 115a. The electrically floating conductive plates 114a and 116a help reduce the parasitic capacitance in the integrated circuit 1c.

Figure 10:
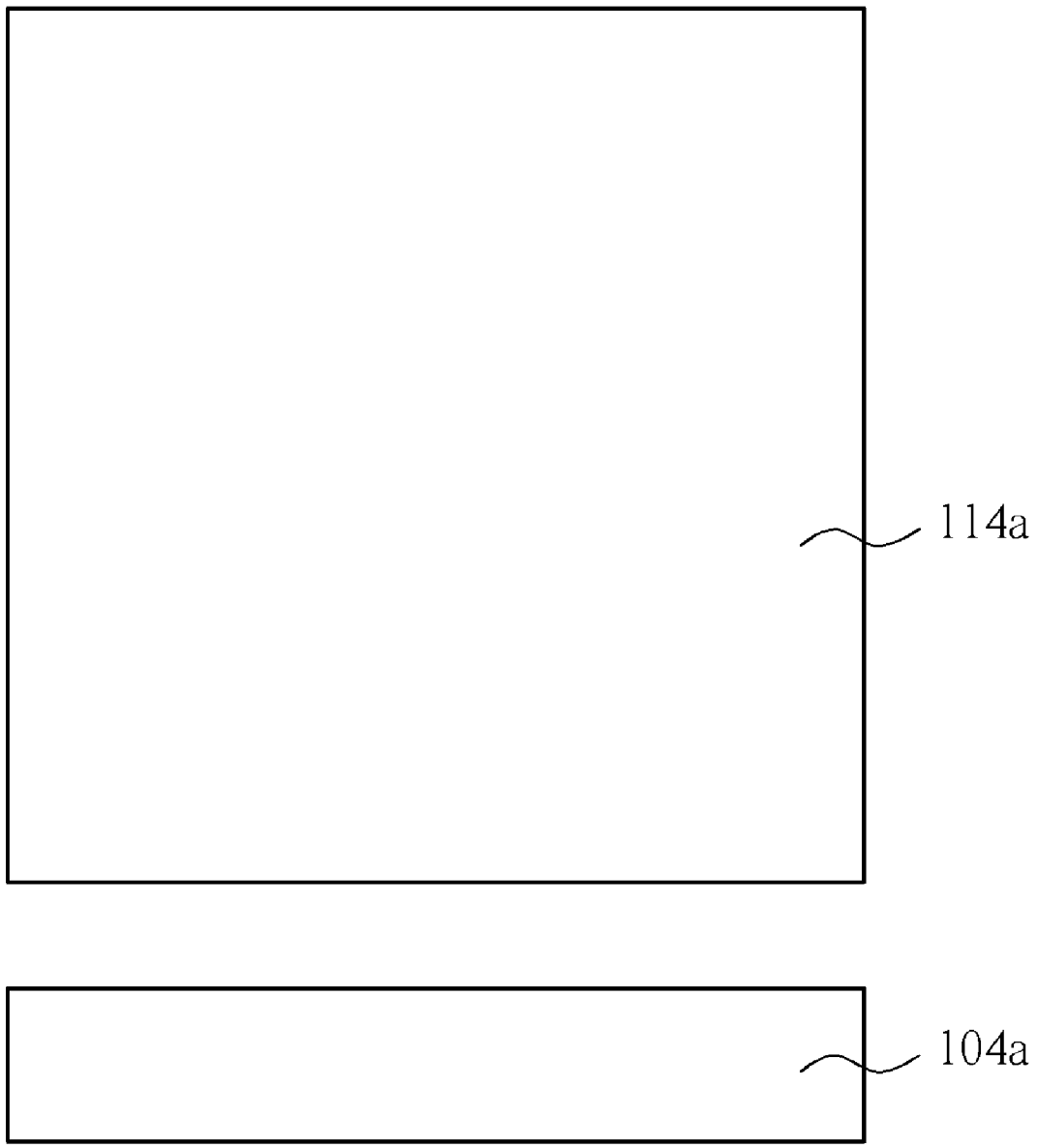
FIG. 10 is a top view of the conductive block and the conductive plate of the integrated circuit of FIG. 9.

FIG. 10 is a top view of the conductive block 104a and the electrically floating conductive plate 114a of the bond pad structure 100c of FIG. 9. As shown in FIG. 10, the conductive block 104a is electrically isolated from the conductive plate 114a. The unitary and floating conductive plate 114a has much larger surface area than that of the conductive block 104a. For the sake of simplicity, only the conductive block 104a and the electrically floating conductive plate 114a are demonstrated. As previously mentioned, the bond pad structure 100c further comprises an electrically floating conductive plate (not explicitly shown in FIG. 10) that is situated directly under the electrically floating conductive plate 114a and is connected with the electrically floating conductive plate 114a through dummy via plugs (not explicitly shown in FIG. 10).

Further, it is to be understood that there may be one or more than one floating conductive piece or plate, for example, two, three or four floating conductive pieces or plates. The floating conductive piece or plate may be fabricated in any layer of the interconnection structure of the integrated circuit, not limited to Mn−1 or Mn metal layer.

Those skilled in the art will readily observe that numerous modifications and alterations of the device and method may be made while retaining the teachings of the invention.

What is claimed is:

1. A bond pad structure of an integrated circuit, comprising:
    a conductive pad disposed on a first dielectric layer;
    a first conductive block formed in a second dielectric layer below the first dielectric layer and electrically connected to the conductive pad through a first via plug formed in the first dielectric layer; and
    an electrically floating first conductive plate formed in the second dielectric layer and situated under the conductive pad.

2. The bond pad structure of claim 1 wherein both of the first conductive block and the electrically floating first conductive plate are respectively a portion of a topmost metal layer of the integrated circuit, wherein the topmost metal layer is under the conductive pad.

3. The bond pad structure of claim 1 wherein both of the first conductive block and the electrically floating first conductive plate are situated directly under the conductive pad.

4. The bond pad structure of claim 1 wherein the electrically floating first conductive plate has a larger surface area than that of the first conductive block.

5. The bond pad structure of claim 1 further comprising a second conductive block formed in a third dielectric layer below the second dielectric layer, wherein the second conductive block is electrically connected to the first conductive block through a second via plug formed in the second dielectric layer.

6. The bond pad structure of claim 5 wherein the second via plug is formed integrally with the first conductive block.

7. The bond pad structure of claim 1 wherein the first via plug is formed integrally with the conductive pad.

8. The bond pad structure of claim 1 further comprising an electrically floating second conductive plate situated directly under the electrically floating first conductive plate.

9. The bond pad structure of claim 8 wherein the electrically floating second conductive plate is connected with the electrically floating first conductive plate through a dummy via plug.

10. The bond pad structure of claim 1 wherein an active circuit is situated directly under the bond pad structure.

11. A bond pad structure of an integrated circuit, comprising:
- a conductive pad disposed on a first dielectric layer;
- a first conductive frame formed in a second dielectric layer below the first dielectric layer and electrically connected to the conductive pad through a first via plug formed in the first dielectric layer; and
- an electrically floating first conductive piece situated under the conductive pad and surrounded by the first conductive frame.

12. The bond pad structure of claim 11 wherein both of the first conductive frame and the electrically floating first conductive piece are fabricated in a topmost metal layer of the integrated circuit, wherein the topmost metal layer is under the conductive pad.

13. The bond pad structure of claim 11 wherein both of the first conductive frame and the electrically floating first conductive piece are situated directly under the conductive pad.

14. The bond pad structure of claim 11 wherein the first conductive frame has a shape and dimensions corresponding to a peripheral contour of the conductive pad.

15. The bond pad structure of claim 11 further comprising a second conductive frame formed in a third dielectric layer below the second dielectric layer, wherein the second conductive frame is electrically connected to the first conductive frame through a second via plug formed in the second dielectric layer.

16. The bond pad structure of claim 15 wherein the second via plug is formed integrally with the first conductive frame.

17. The bond pad structure of claim 11 wherein the first via plug is formed integrally with the conductive pad.

18. The bond pad structure of claim 11 further comprising an electrically floating second conductive piece situated directly under the electrically floating first conductive piece.

19. The bond pad structure of claim 18, wherein the electrically floating second conductive piece is connected with the electrically floating first conductive piece through a dummy via plug.

20. The bond pad structure of claim 18 wherein the electrically floating second conductive piece is surrounded by the second conductive frame.

21. A bond pad structure of an integrated circuit, comprising:
- a conductive pad disposed on a first dielectric layer;
- a first conductive block formed in a second dielectric layer below the first dielectric layer and electrically connected to the conductive pad through a first via plug; and
- an electrically floating first conductive plate situated under the conductive pad.

22. The bond pad structure of claim 1 wherein the first conductive block is isolated from the electrically floating first conductive plate.

* * * * *